United States Patent
Hirano et al.

(12)

(10) Patent No.: US 6,221,509 B1
(45) Date of Patent: Apr. 24, 2001

(54) SEMICONDUCTOR ENCAPSULATING EPOXY RESIN COMPOSITIONS, AND SEMICONDUCTOR DEVICES ENCAPSULATED THEREWITH

(75) Inventors: Tatsurou Hirano; Nobukazu Suzuki, both of Koriyama; Toshio Shiobara, Gunma-ken; Takayuki Aoki, Gunma-ken; Shoichi Osada, Gunma-ken, all of (JP)

(73) Assignees: Tatsumori Ltd.; Shin-Etsu Chemical Co., Ltd., both of Tokyo (JP)

( * ) Notice: Subject to any disclaimer, the term of this patent is extended or adjusted under 35 U.S.C. 154(b) by 0 days.

(21) Appl. No.: 09/291,285

(22) Filed: Apr. 14, 1999

(30) Foreign Application Priority Data

Apr. 16, 1998 (JP) .................................. 10-122805

(51) Int. Cl.$^7$ ..................................... H01L 29/12
(52) U.S. Cl. ............................ 428/620; 523/466
(58) Field of Search .............................. 523/466; 428/620

(56) References Cited

U.S. PATENT DOCUMENTS 5,298,548 * 3/1994 Shiobara et al. .

FOREIGN PATENT DOCUMENTS

| 58-029858 | * 2/1983 | (JP) . |
|---|---|---|
| 58-68955 | 4/1983 | (JP) . |
| 61-85432 | 5/1986 | (JP) . |
| 280428 | 3/1990 | (JP) . |
| 4349146 | 12/1992 | (JP) . |
| 72617 | 1/1995 | (JP) . |
| 9227326 | 9/1997 | (JP) . |

OTHER PUBLICATIONS

*Chemical Abstracts*, vol. 99, No. 12, Abstract No. 89336 (Sep. 9, 1983).
*Chemical Abstracts*, vol. 126, No. 12, Abstract No. 165458 (Mar. 24, 1997).

* cited by examiner

*Primary Examiner*—Robert Dawson
*Assistant Examiner*—D. Aylward

(57) ABSTRACT

In semiconductor encapsulating epoxy resin compositions comprising an epoxy resin, a curing agent and an inorganic filler, 1–90% by weight of the inorganic filler is spherical cristobalite. The compositions are able to achieve higher loadings of inorganic filler, allow easy control of the coefficient of thermal expansion, and provide high-quality cured products having improved thermal conductivity and low moisture absorption.

14 Claims, 2 Drawing Sheets

SPHERICAL CRISTOBALITE (1000X)

STARTING SPHERICAL FUSED SILICA (1000X)

SEMICONDUCTOR ENCAPSULATING EPOXY RESIN COMPOSITIONS, AND SEMICONDUCTOR DEVICES ENCAPSULATED THEREWITH

BACKGROUND OF THE INVENTION

1. Field of the Invention

The present invention relates to epoxy resin compositions suitable for semiconductor encapsulation comprising an epoxy resin, a curing agent, and an inorganic filler. The invention also relates to semiconductor devices encapsulated with these compositions in a cured state.

2. Prior Art

Epoxy resin compositions used as encapsulants for the latest low-profile packages are loaded with greater amounts of spherical fused silica for reducing moisture absorption and preventing crack formation when the package is soldered to a substrate. However, such a high loading of fused silica results in a very small coefficient of thermal expansion. When copper is used as the lead frame material, the difference between the expansion coefficient of the lead frame and the expansion coefficient of the epoxy resin composition becomes large. This results in greater stress during thermal cycling and solder reflow,,and thus a higher tendency for crack formation.

One traditional approach to this problem is to modify the expansion coefficient of the epoxy resin composition by mixing the fused silica with another inorganic filler having a large coefficient of expansion. Many patents describe the formulation of mixtures of fused silica and crystalline silica as the inorganic filler in epoxy resin compositions.

However, because the crystalline silica used in these patents is composed entirely of crushed material, crystalline silica cannot be included in the amount required in recent compositions having high loadings of spherical fused silica. As a consequence, it was impossible to lower the moisture absorption of the cured encapsulant to the desired level. The alternative is to use spherical crystalline silica. Unfortunately, spherical crystalline silica is very difficult to obtain because it cannot be industrially manufactured. While some spherical crystalline silica is naturally available, this is the product of long years of wear in streambeds. As such, its use for encapsulating state-of-the-art semiconductor devices leaves something to be desired in terms of purity. In addition, such material cannot be given a particle size distribution optimal for high loadings.

SUMMARY OF THE INVENTION

It is therefore an object of the present invention to provide semiconductor encapsulating epoxy resin compositions which are capable of high loadings of inorganic filler, allow easy control of the coefficient of thermal expansion, and give cured products having a high thermal conductivity and a low moisture absorption. Another object of the invention is to provide semiconductor devices encapsulated with these compositions in a cured state.

We have found that, by forming cristobalite from spherical fused silica adjusted to the optimal particle diameter, spherical fused silica can be crystallized from the fused state to cristobalite while retaining the original shape and particle size distribution. The spherical cristobalite, thus obtained without alteration of the particle size distribution or shape, allows higher loadings of inorganic filler, higher thermal conductivity, and easy control of the coefficient of expansion to be achieved. By including the resulting spherical cristobalite as a filler in a specific proportion within an epoxy resin composition, the composition can be endowed with higher filler contents and better thermal conductivity, the coefficient of expansion can be adjusted as desired, and the moisture absorption can be reduced.

Accordingly, the present invention provides a semiconductor encapsulating epoxy resin composition comprising an epoxy resin, a curing agent, and an inorganic filler, wherein 1 to 90% by weight of the inorganic filler is spherical cristobalite. The invention also provides a semiconductor device encapsulated within this composition in a cured state.

Owing to the blending of spherical cristobalite as an inorganic filler in an amount of 1 to 90% by weight of the entire filler, the epoxy resin compositions are capable of high loadings of inorganic filler and allow easy control of the coefficient of thermal expansion. The compositions provide cured products having a high thermal conductivity and low moisture absorption, and are highly suitable as encapsulants for state-of-the-art low-profile packages and other applications.

DETAILED DESCRIPTION OF THE INVENTION

Figure 1:
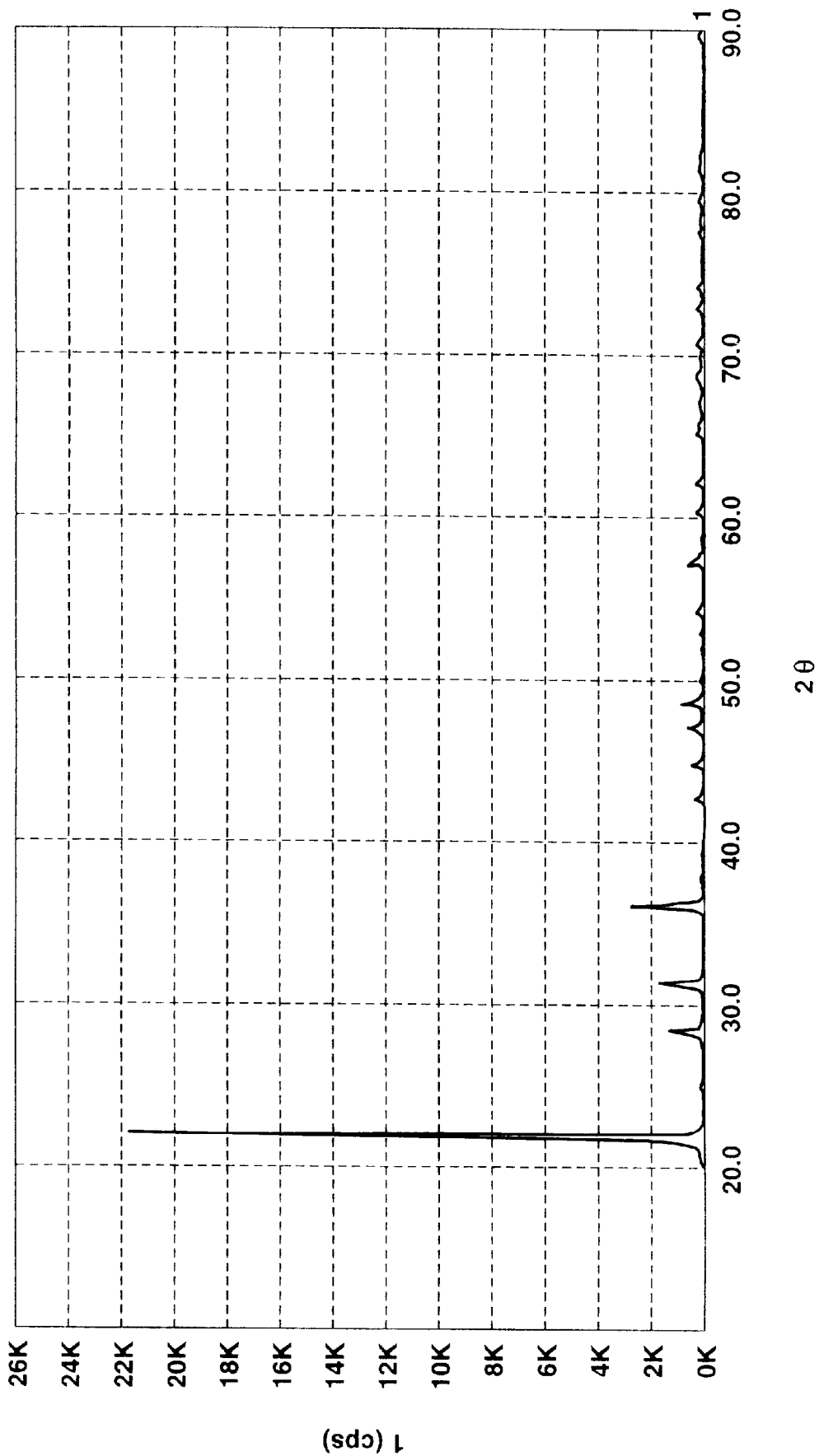
FIG. 1 is a graph showing the x-ray diffraction analysis results for the spherical cristobalite obtained in Preparation Example 1.

The semiconductor encapsulating epoxy resin composition of the present invention contains an epoxy resin, a curing agent, and an inorganic filler as essential components.

The epoxy resin used herein may be any known epoxy resin having two or more epoxy groups per molecule. Illustrative examples include bisphenol-type epoxy resins such as bisphenol A epoxy resin and bisphenol F epoxy resin; novolac-type epoxy resins such as phenolic novolac epoxy resin and cresol novolac epoxy resin; as well as naphthalene epoxy resins, triphenolalkane epoxy resins, biphenyl epoxy resins, phenolaralkyl epoxy resins, biphenylaralkyl epoxy resins, and cyclopentadiene epoxy resins. Of these, epoxy resins having the liquid-crystal structures represented by the following structural formulas are preferred.

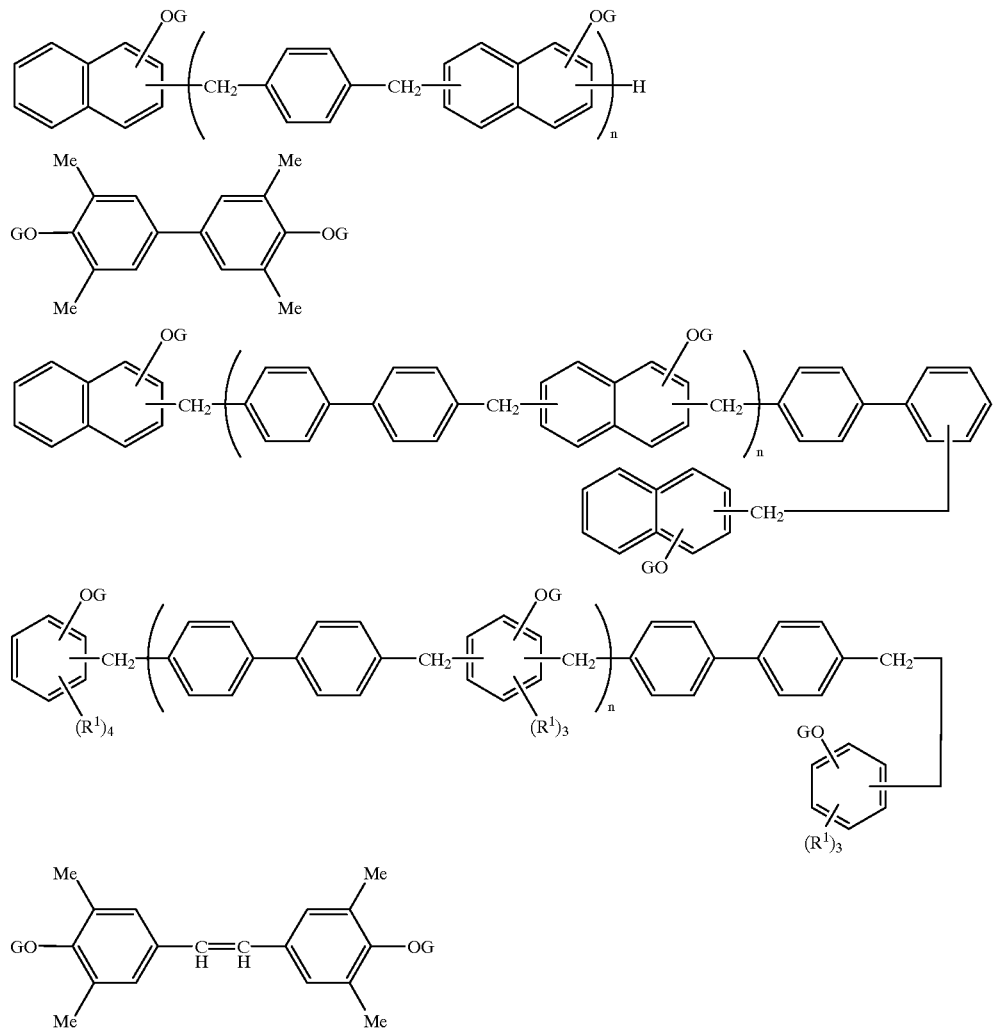

In these formulas, G is glycidyl; Me is methyl; each $R^1$ is independently hydrogen, an alkyl having 1 to 4 carbon atoms, or phenyl; and n is an integer from 1 to 10.

These epoxy resins preferably have a total chlorine content of not more than 1,500 ppm, and especially not more than 1,000 ppm. When chlorine is extracted from the epoxy resin with water at an epoxy resin concentration of 50% and a temperature of 120° C. over a period of 20 hours, the water-extracted chlorine content is preferably not more than 5 ppm. At a total chlorine content greater than 1,500 ppm or a water-extracted chlorine level of more than 5 ppm, the encapsulated semiconductor would become less reliable in the presence of moisture.

Any curing agent may be used insofar as it is a phenolic resin having at least two phenolic hydroxyl groups in a molecule. Exemplary curing agents include bisphenol-type resins such as bisphenol A and bisphenol F; novolac-type phenolic resins such as phenolic novolac resin and cresol novolac resin; phenolic aralkyl resins, triphenolalkane resins, naphthalene phenolic resins, biphenyl resins, and cyclopentadiene phenolic resins; as well as phenolic hydroxyl group-bearing resins having the structures shown below.

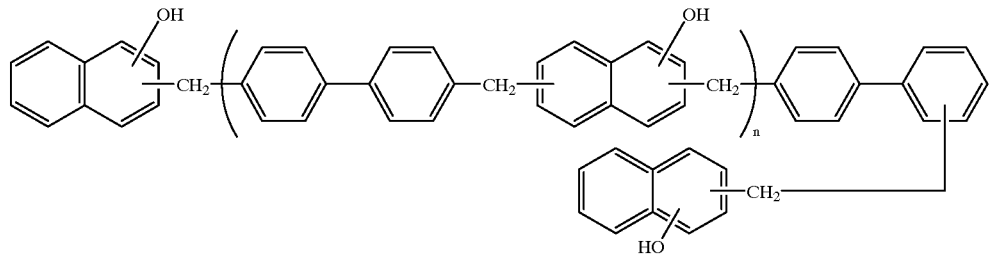

-continued

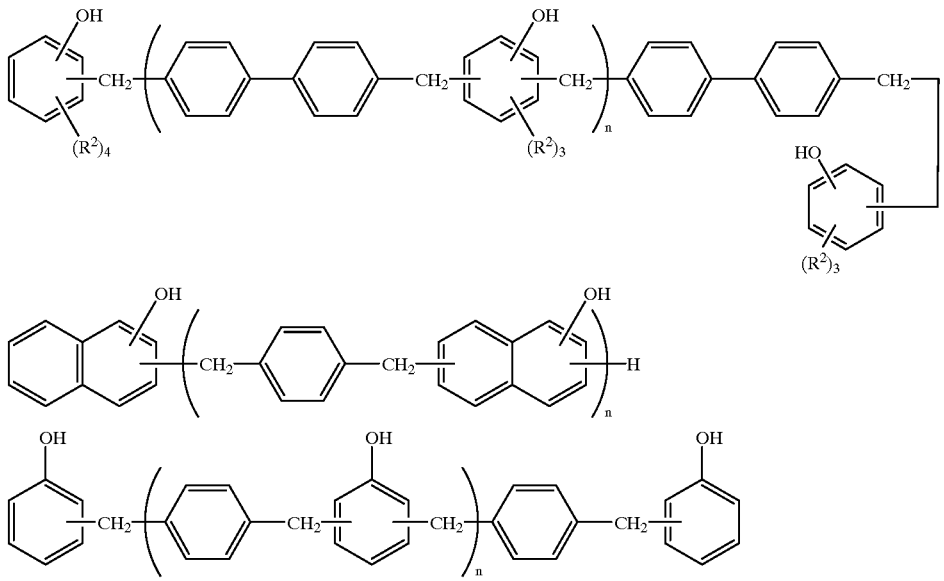

In the above formulas, each $R^2$ is independently hydrogen, an alkyl having 1 to 4 carbon atoms, or phenyl; and n is an integer from 0 to 10.

The respective contents of chloride ions, sodium ions, and the like extracted from the phenol resin at 120° C. by the same procedure as that described above for extracting chlorine from the epoxy resin, are preferably not more than 10 ppm, and especially not more than 5 ppm.

The phenolic resin is preferably used in an amount corresponding to 0.5 to 1.6 moles, and especially 0.6 to 1.4 moles, of phenolic hydroxyl groups in the phenolic resin per mole of epoxy groups in the epoxy resin. Less than 0.5 mole of phenolic hydroxyl groups, meaning the paucity of hydroxyl groups, would result in a higher proportion of epoxy group homopolymerization, which lowers the glass transition temperature of the epoxy resin composition. On the other hand, more than 1.6 moles of phenolic hydroxyl groups would result in a decline in reactivity as well as a low crosslink density and insufficient strength in the cured state.

A curing accelerator is preferably blended in the epoxy resin composition. Illustrative examples of curing accelerators that may be used include organic phosphorus compounds such as triphenylphosphine, 2,6- or 2,4,6-methoxy-substituted triphenylphosphine derivatives, quaternary salts of these triphenylphosphine compounds and tetraphenylphosphonium tetraphenylborate and its derivatives; imidazole derivatives such as 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole and 2-phenyl-4,5-dihydroxymethylimidazole; and cycloamidine derivatives such as 1,8-diazabicyclo[5.4.0]undecene-7. The curing accelerator is preferably blended in an amount of 0 to 10 parts by weight, more preferably 0.01 to 5 parts by weight per 100 parts by weight of the epoxy resin and phenolic resin combined.

The composition of the invention is characterized by the blending of spherical cristobalite as the inorganic filler. The spherical cristobalite can be obtained by cristobalite conversion from spherical fused silica produced by a method known to the art. Preferably, the spherical fused silica serving as the starting material has a mean particle diameter of 0.3 to 50 μm, especially 0.5 to 30 μm, and most especially 1.0 to 20 μm, and has a maximum particle diameter of not more than 150 μm, especially not more than 100 μm, and most especially not more than 75 μm. Particles with a mean particle diameter larger than 50 μm are too coarse and may cause clogging of the gate to the mold or mold wear. On the other hand, particles with a mean particle diameter smaller than 0.3 μm are too fine and may render high loadings in the composition difficult. Likewise, particles with a maximum particle diameter greater than 150 μm are too coarse, which can cause clogging of the gate to the mold or mold wear. The mean particle diameter as used herein can be determined, for example, as the weight average (median diameter) in the particle size distribution as measured by the laser light diffraction method.

The spherical fused silica preferably contains as impurities not more than 20 ppm, and especially not more than 10 ppm, of alkali metals such as sodium and potassium and of halogen elements such as fluorine, chlorine and bromine, respectively. The use as a filler of cristobalite obtained from spherical fused silica in which the content of either type of impurity is greater than 20 ppm results in a diminished moisture resistance. The alkali metal content and the halogen element content are determined by placing a 10 g sample of the spherical fused silica in a 250 cc plastic container, adding 100 cc of pure water, and shaking for 30 minutes. The sample and water are then left to stand for 20 hours in a constant-temperature tank at 95° C. After the sample is separated off, the alkali metal content and halogen element content extracted in water are measured by ion chromatography.

In the practice of the invention, the spherical fused silica starting material crystallizes from the fused state to cristobalite while retaining its shape and particle size distribution. Accordingly, by using as the starting material a high-purity synthetic spherical silica having a very low content of uranium and thorium as impurities, particularly uranium and thorium contents below 1 ppb, there can be obtained spherical cristobalite which is highly suitable for use with memory devices.

This type of spherical fused silica can be converted to cristobalite by heating at an elevated temperature of 1,200 to 1,600° C., and especially 1,200 to 1,500° C., for a period of 10 to 50 hours, and especially 15 to 40 hours, to induce reliable growth of the crystals, then cooling. In this process, the rate of temperature rise from room temperature to the target temperature is preferably 10 to 100° C./min. At a maximum heating temperature below 1,200° C., complete conversion to cristobalite would take too long, whereas heating to a temperature above 1,600° C. would cause the spherical fused silica particles to bond with each other, making it impossible to maintain the original particle size distribution. A heating time shorter than 10 hours would not allow crystallization to proceed to a sufficient degree. On the other hand, heating for more than 50 hours does provide enough time for crystallization, but maintaining an elevated temperature for such a long time increases production costs.

Since the resulting spherical cristobalite retains the shape and particle size distribution of the fused silica starting material, high loadings in the epoxy resin composition are possible and the thermal conductivity of the composition can be enhanced. Moreover, owing to the spherical shape of the cristobalite particles, the resulting compositions cause very low mold wear even with high loadings of filler.

The spherical cristobalite may be used after surface treatment with a coupling agent, suitable examples of which include silane coupling agents, titanium coupling agents, and aluminum coupling agents.

The epoxy resin compositions of the invention include also an inorganic filler other than the above-described spherical cristobalite. Illustrative examples of the other inorganic filler include fused silica ground in an apparatus such as a ball mill, spherical silica obtained by flame fusion, spherical silica produced by a technique such as the sol-gel process, crystalline silica, alumina, boron nitride, aluminum nitride, silicon nitride, magnesia, and magnesium silicate. To achieve high loadings of inorganic filler in the epoxy resin composition, it is desirable that all of the filler used be spherical. Spherical fused silica is especially preferred as the other inorganic filler.

The spherical cristobalite described above is compounded within the epoxy resin composition of the invention in an amount, based on the overall filler, within a range of 1 to 90% by weight, preferably 5 to 70% by weight, and more preferably 10 to 50% by weight. Less than 1% by weight of spherical cristobalite achieves little compounding effect, failing to attain the object of the invention. On the other hand, the inclusion of more than 90% by weight of spherical cristobalite provides the composition with a very large coefficient of expansion, increasing stress on the semiconductor device. Because cristobalite undergoes an abrupt increase of expansion coefficient above 200° C., loadings of cristobalite in excess of 90% by weight of the filler presents an increased risk of device failure due to stress and other undesirable effects.

In general, the total amount of inorganic fillers used in the inventive epoxy resin compositions is preferably 300 to 1,200 parts by weight, especially 500 to 1,000 parts by weight, and most especially 600 to 1,000 parts by weight, per 100 parts by weight of the epoxy resin and curing agent combined. The use of less than 300 parts by weight of inorganic filler would not enable a sufficient decrease in the coefficient of expansion to be achieved, in addition to which moisture absorption would rise, which can lead to crack formation in the package at the solder reflow temperature. On the other hand, the use of more than 1,200 parts by weight would result in a composition which is too viscous to mold.

Ultrafine silica such as fumed silica and precipitated silica (e.g., Aerosil) may be added to the inventive compositions to impart thixotropy. Where use is made of this type of ultrafine silica, it is preferable to premix ultrafine silica uniformly with the other fillers in a mixing apparatus such as a ball mill before the fillers are blended with the resin components.

Stress-reducing agents may also be added to the inventive compositions. Exemplary stress-reducing agents are known silicone rubber and gel in powder form, silicone-modified epoxy resins, silicone-modified phenolic resins, and methyl methacrylate-butadiene-styrene thermoplastic resins. Such resins may be added in a customary amount insofar as the objects of the invention are not compromised.

Other optional ingredients that may be added to the invention compositions include coupling agents (e.g., silane coupling agents, titanium coupling agents, and aluminum coupling agents), colorants such as carbon black, and wetting enhancers and anti-foaming agents (e.g., nonionic surfactants, fluorochemical surfactants, and silicone oil). These optional ingredients may be added in customary amounts insofar as the objects of the invention are attainable.

The semiconductor encapsulating epoxy resin compositions of the present invention may be prepared by uniformly mixing the ingredients described above in a suitable apparatus such as a high-speed mixer, then thoroughly working the mixture in a two-roll mill, a continuous kneading apparatus or the like. The mixture is preferably worked at a temperature of 50 to 110° C., following which it is formed into a thin sheet, cooled, and finely divided to give the desired epoxy resin composition.

Since spherical cristobalite is blended as part of the inorganic filler, the semiconductor encapsulating epoxy resin compositions of the present invention are able to achieve higher loadings of inorganic filler and enable the coefficient of thermal expansion to be easily controlled. The compositions cure into high-quality products having a higher thermal conductivity and low moisture absorption. The epoxy resin compositions of the invention are thus highly suitable for use as semiconductor encapsulants in state-of-the-art devices.

EXAMPLE

The following examples are provided to illustrate the invention, and are not intended to limit the scope thereof. All parts and percents are by weight.

Preparation Example 1

Spherical fused silica having the particle size distribution shown in Table 1 was left to stand at 1,500° C. for 20 hours. Thereafter, the temperature was lowered at a rate of 100° C. per hour down to a final temperature of 25° C.

Figure 2A:
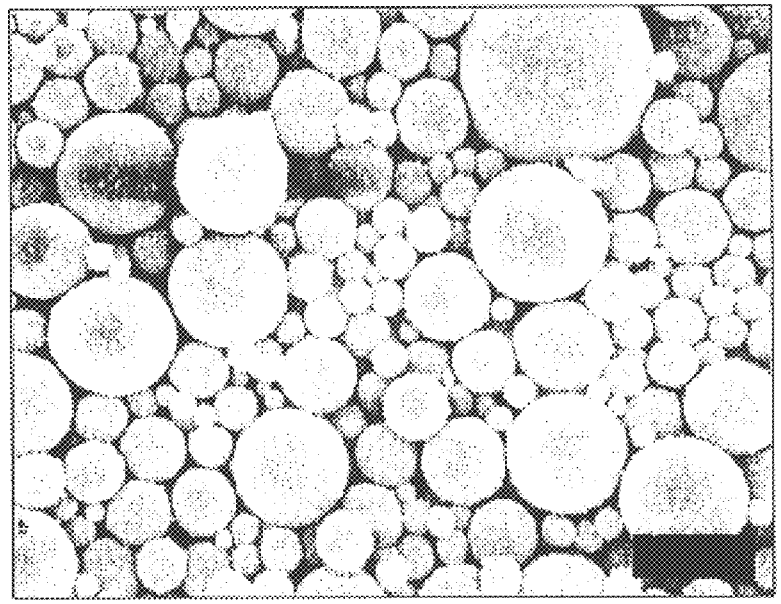
FIGS. 2A and 2B are electron micrographs, at an enlargement of 1,000X, of the spherical cristobalite obtained in Preparation Example 1 and the spherical fused silica starting material, respectively.
Figure 2B:
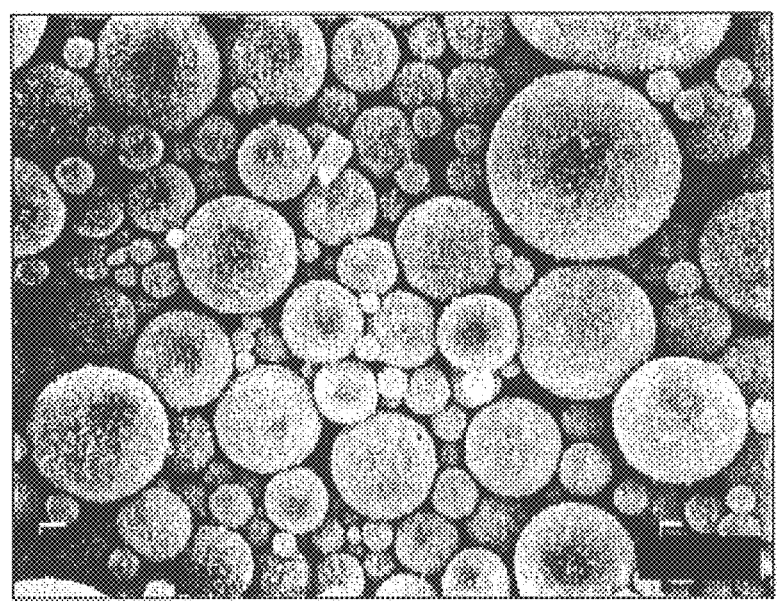

There was obtained spherical cristobalite which was examined for particle shape under an electron microscope. The particle size distribution was then determined and the crystal structure was ascertained by x-ray diffraction analysis. The particle size distribution is shown in Table 1, and the x-ray diffraction diagram is shown in FIG. 1. FIGS. 2A and 2B are electron micrographs (magnification, 1,000X) of the spherical cristobalite obtained and the spherical fused silica starting material, respectively.

TABLE 1

| | | Spherical fused silica (starting material) | Spherical cristobalite (product used in invention) |
|---|---|---|---|
| Particle size | ≦96 μm | 100.0 | 100.0 |
| | ≦64 μm | 95.8 | 96.7 |

TABLE 1-continued

|  |  | Spherical fused silica (starting material) | Spherical cristobalite (product used in invention) |
|---|---|---|---|
| distribution | ≦48 μm | 88.4 | 90.8 |
| (cumulative wt %) | ≦24 μm | 60.1 | 62.2 |
|  | ≦12 μm | 39.9 | 42.9 |
|  | ≦6 μm | 22.5 | 25.8 |
|  | ≦3 μm | 13.3 | 14.2 |
|  | ≦1.5 μm | 4.4 | 5.6 |
| Mean particle diameter (μm) |  | 17.3 | 16.2 |
| True specific gravity |  | 2.2 | 2.36 |
| Specific surface (m²/g) |  | 0.9 | 1.0 |
| Extracted | Alkali metal ions | 9 | 8 |
| impurities (ppm) | Halide ions | 12 | 10 |

Preparation Examples 2 to 6

The spherical fused silica used in Preparation Example 1 was converted to cristobalite under the production conditions shown in Table 3. Table 3 also shows the physical properties of the resulting silicas.

Preparation Example 7

The crushed fused silica shown in Table 2 was converted to cristobalite under the production conditions shown in Table 3. Table 3 also shows the physical properties of the resulting silica.

TABLE 2

|  |  | Crushed fused silica |
|---|---|---|
| Particle | ≦96 μm | 100.0 |
| size | ≦64 μm | 95.8 |
| distribution | ≦48 μm | 88.4 |
| (cumulative wt %) | ≦24 μm | 60.1 |
|  | ≦12 μm | 39.9 |
|  | ≦6 μm | 22.5 |
|  | ≦3 μm | 13.3 |
|  | ≦1.5 μm | 4.4 |
| Mean particle diameter (μm) |  | 17.3 |
| True specific gravity |  | 2.2 |
| Specific surface (m²/g) |  | 0.9 |

EXAMPLES 1 to 4

Comparative Examples 1 and 2

Six epoxy resin compositions were prepared by measuring out 43.2 parts of epoxy resin YX4000 (Yuka Shell Co., Ltd.) represented by

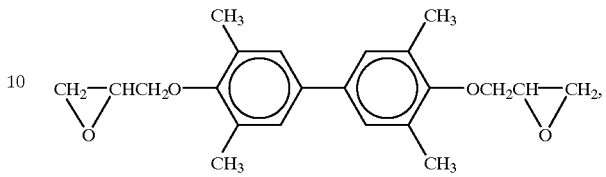

51.8 parts of curing agent Mylex (aralkyl phenolic resin, Mitsui Toatsu Chemicals, Inc.), 5 parts of brominated epoxy resin Bren-S (Nippon Kayaku Co., Ltd.), inorganic fillers of the types and in the amounts shown in Table 4, 5 parts of antimony trioxide, 1.5 parts of carbon black as a colorant, 1.0 part of silane coupling agent KBM403 (γ-glycidoxypropyl-trimethoxysilane, Shin-Etsu Chemical Co., Ltd.), 1.2 parts of carnauba wax as a parting agent, and 0.8 part of triphenylphosphine catalyst (Hokko Chemical Industry Co., Ltd.). These ingredients were agitated and mixed together for 10 minutes in a high-speed mixer, then kneaded in a continuous extruder.

The following properties were measured for each of the resulting epoxy resin compositions. The results are shown in Tables 4 and 5.

(1) Spiral Flow

The spiral flow was measured by transfer molding the composition at a temperature of 175° C. and a pressure of 70 kgf/cm².

(2) Gel Time

Measured as the time until the epoxy resin composition gelled on a hot plate at 175° C.

(3) Melt Viscosity

The melt viscosity was measured at 175° C. with a constant-load orifice-type flow testing apparatus of the kind known in Japan as a Koka-type flow tester, under a pressure of 10 kg, and using a nozzle having a diameter of 1 mm.

(4) Hardness as molded

An epoxy resin composition was molded at 175° C. and 70 kgf/cm² for 90 seconds into a bar of 10×4×100 mm according to JIS K-6911. Using a Barcol hardness tester, the bar was measured for hot hardness.

TABLE 3

|  |  | Preparation Example |  |  |  |  |  |
|---|---|---|---|---|---|---|---|
|  |  | 2 | 3 | 4 | 5 | 6 | 7 |
| Maximum temperature (° C.) |  | 1300 | 1600 | 1500 | 1000 | 800 | 1500 |
| Heating time (hours) |  | 40 | 15 | 20 | 40 | 50 | 20 |
| True specific gravity |  | 2.33 | 2.35 | 2.34 | 2.32 | 2.20 | 2.31 |
| Specific surface (m²/g) |  | 1.0 | 0.9 | 1.0 | 1.0 | 1.0 | 1.1 |
| X-ray diffraction analysis |  | cristo-balite | cristo-balite | cristo-balite | cristo-balite | amorphous | cristo-balite |
| Particle | ≦96 μm | 100.0 | 100.0 | 100.0 | 100.0 | 100.0 | 100.0 |
| size | ≦64 μm | 96.8 | 97.2 | 96.3 | 95.7 | 95.7 | 96.2 |
| distribution | ≦48 μm | 86.4 | 85.2 | 85.4 | 88.1 | 87.9 | 87.2 |
| (cumulative wt %) | ≦24 μm | 62.3 | 63.5 | 65.2 | 61.2 | 61.2 | 61.5 |
|  | ≦12 μM | 38.6 | 37.9 | 36.8 | 38.2 | 40.1 | 42.0 |
|  | ≦6 μm | 23.4 | 24.1 | 26.4 | 23.8 | 21.9 | 23.4 |
|  | ≦3 μm | 14.2 | 13.9 | 13.4 | 12.1 | 13.9 | 14.2 |
|  | ≦1.5 μm | 5.2 | 4.9 | 5.5 | 4.9 | 4.0 | 4.4 |
| Shape |  | spherical | spherical | spherical | spherical | spherical | crushed |

(5) Glass Transition Temperature (Tg) and Expansion Coefficient

Test specimens with dimensions of 4×4×15 mm were molded at 175° C. and 70 kgf/cm² for a time of 2 minutes and post-cured at 180° C. for 4 hours. Measurement was carried out by heating the test specimen at a rate of 5° C./min in a dilatometer.

(6) Moisture Absorption

Discs having a diameter of 50 mm and a thickness of 3 mm were molded at 175° C. and 70 kgf/cm² for a time of 2 minutes and post-cured at 180° C. for 4 hours. The discs were left to stand at 85° C. and 85% RH for 72 hours, following which the moisture absorption was measured.

(7) Cracking Resistance after Moisture Absorption

Chips measuring 6.5×6.5 mm were mounted on 100-pin quad flat pack (QFP) leadframes (dimensions, 14×20×2.7 mm) having a copper frame, then encapsulated with the epoxy resin compositions obtained in Examples 1, 2 and 4, and Comparative Examples 1 and 2. In each case, encapsulation was carried out at a molding temperature of 175° C., a molding pressure of 70 kgf/cm², and a molding time of 2 minutes, and was followed by a 4-hour postcure at 180° C. The five packages encapsulated by the respective resin compositions were left to stand at 85° C. and 85% RH for 72 hours to induce moisture absorption. The packages were subjected to three infrared reflow cycles at a peak temperature of 240° C. The solder reflow resistance was rated for both internal cracking and external cracking, with the result being reported by the number of cracked samples per 10 samples.

TABLE 4

| | | Example | | | | Comparative Example | |
|---|---|---|---|---|---|---|---|
| | | 1 | 2 | 3 | 4 | 1 | 2 |
| Inorganic filler | Type | Prep. Ex. 1 (spherical cristobalite) | Prep. Ex. 2 (spherical cristobalite) | Prep. Ex. 3 (spherical cristobalite) | Prep. Ex. 5 (spherical cristobalite) | Prep. Ex. 6 (amorphous silica) | Prep. Ex. 7 (crushed cristobalite) |
| | Amount (pbw) | 100 | 225 | 125 | 530 | 225 | 225 |
| | Type | Spherical fused silica starting material in Prep. Ex. 1 | Spherical fused silica starting material in Prep. Ex. 1 | Spherical alumina | Spherical fused silica starting material in Prep. Ex. 1 | Spherical fused silica starting material in Prep. Ex. 1 | Spherical fused silica starting material in Prep. Ex. 1 |
| | Amount (pbw) | 800 | 675 | 775 | 370 | 675 | 675 |
| Spiral flow (cm) | | 115 | 109 | 95 | 120 | 104 | 38 |
| Gel time (s) | | 25 | 24 | 25 | 23 | 25 | 20 |
| Melt viscosity (poise) | | 120 | 105 | 150 | 124 | 130 | 720 |
| Hardness when molded | | 62 | 65 | 72 | 65 | 61 | 58 |
| Tg (° C.) | | 120 | 124 | 119 | 121 | 125 | 123 |
| Expansion coeff. (ppm) | | 10 | 12 | 17 | 17 | 10 | 12 |
| Moisture absorption (%) | | 0.08 | 0.08 | 0.06 | 0.07 | 0.08 | 0.09 |

TABLE 5

| | | IR reflow after 72 hours standing at 85° C. and 85% RH | |
|---|---|---|---|
| | | Internal cracks | External cracks |
| Example | 1 | 0/10 | 0/10 |
| | 2 | 0/10 | 0/10 |
| | 4 | 0/10 | 0/10 |

TABLE 5-continued

| | | IR reflow after 72 hours standing at 85° C. and 85% RH | |
|---|---|---|---|
| | | Internal cracks | External cracks |
| Comparative Example | 1 | 5/10 | 0/10 |
| | 2 | Viscosity was too high, causing the die pad to shift and making evaluation impossible. | |

Japanese Patent Application No. 122805/1998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating epoxy resin composition comprising an epoxy resin, a curing agent, and an inorganic filler, the inorganic filler comprising 1 to 90% by weight of spherical cristobalite which has been obtained by converting a spherical fused silica, having a mean particle diameter of 0.3 to 50 μm and a maximum particle diameter of not more than 150 μm, to cristobalite.

2. The semiconductor encapsulating epoxy resin composition of claim 1, wherein the inorganic filler is comprised of spherical cristobalite and spherical fused silica.

3. A semiconductor device encapsulated with the semiconductor encapsulating epoxy resin composition of claim 1 in a cured state.

4. The semiconductor encapsulating epoxy resin composition of claim 1, wherein the spherical fused silica has a mean particle diameter of 0.5 to 30 μm and a maximum particle diameter of not more than 100 μm.

5. The semiconductor encapsulating epoxy resin composition of claim 1, wherein the spherical fused silica has a mean particle diameter of 1 to 20 μm and a maximum particle diameter of not more than 75 μm.

6. The semiconductor encapsulating epoxy resin composition of claim 1, wherein the spherical fused silica contains not more than 20 ppm of alkali metals and of halogen elements.

7. The semiconductor encapsulating epoxy resin composition of claim 1, wherein the spherical fused silica contains not more than 1 ppb of uranium and thorium.

8. The semiconductor encapsulating epoxy resin composition of claim 1, wherein the spherical fused silica is converted to cristobalite by heating at a temperature of 1200–1600° C. for a period of 10 to 50 hours.

9. The semiconductor encapsulating epoxy resin composition of claim 1, wherein the spherical cristobalite is treated with a coupling agent.

10. The semiconductor encapsulating epoxy resin composition of claim 1, wherein the inorganic filler comprises 5 to 70% by weight of the spherical cristobalite.

11. The semiconductor encapsulating epoxy resin composition of claim 1, wherein the inorganic filler comprises 10 to 50% by weight of the spherical cristobalite.

12. The semiconductor encapsulating epoxy resin composition of claim 1, wherein the total amount of inorganic filler is 300 to 1200 parts by weight per 100 parts by weight of the epoxy resin and curing agent combined.

13. The semiconductor encapsulating epoxy resin composition of claim 1, wherein the total amount of inorganic filler is 500 to 1000 parts by weight per 100 parts by weight of the epoxy resin and curing agent combined.

14. The semiconductor encapsulating epoxy resin composition of claim 1, wherein the total amount of inorganic filler is 600 to 1000 parts by weight per 100 parts by weight of the epoxy resin and curing agent combined.

* * * * *